(12) United States Patent
Yoon et al.

(10) Patent No.: US 8,409,916 B2
(45) Date of Patent: Apr. 2, 2013

(54) THIN FILM TRANSISTOR SUBSTRATE, DISPLAY DEVICE HAVING THE SAME AND METHOD OF MANUFACTURING THE DISPLAY DEVICE

(75) Inventors: Kap-Soo Yoon, Seoul (KR); Sung-Hoon Yang, Seoul (KR); Byoung-June Kim, Seoul (KR); Czang-Ho Lee, Suwon-si (KR); Sung-Ryul Kim, Cheonan-si (KR); Hwa-Yeul Oh, Seoul (KR); Jae-Ho Choi, Seoul (KR); Yong-Mo Choi, Osan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/233,399

(22) Filed: Sep. 15, 2011

(65) Prior Publication Data

US 2012/0003769 A1    Jan. 5, 2012

Related U.S. Application Data

(62) Division of application No. 12/197,573, filed on Aug. 25, 2008, now Pat. No. 8,035,100.

(30) Foreign Application Priority Data

Mar. 26, 2008 (KR) .................................. 2008-28016

(51) Int. Cl.
*H01L 21/00* (2006.01)
*H01L 21/16* (2006.01)

(52) U.S. Cl. ............ 438/104; 438/30; 438/149; 257/43; 257/E29.296

(58) Field of Classification Search .................... 438/30, 438/104, 149; 257/43, E29.296
See application file for complete search history.

(56) References Cited

U.S. PATENT DOCUMENTS

| | | | | |
|---|---|---|---|---|
| 7,923,723 B2* | 4/2011 | Hayashi et al. | .................. | 257/43 |
| 2005/0170565 A1* | 8/2005 | Fujii et al. | ..................... | 438/149 |
| 2005/0170643 A1* | 8/2005 | Fujii et al. | ..................... | 438/637 |
| 2005/0173734 A1* | 8/2005 | Yoshioka et al. | ............. | 257/202 |
| 2009/0072232 A1 | 3/2009 | Hayashi et al. | | |
| 2009/0148971 A1* | 6/2009 | Fujii et al. | ....................... | 438/29 |

FOREIGN PATENT DOCUMENTS

JP    2007-250982 A    9/2007

* cited by examiner

*Primary Examiner* — Telly Green
(74) *Attorney, Agent, or Firm* — Cantor Colburn LLP

(57) ABSTRACT

A thin film transistor substrate includes an insulating plate; a gate electrode disposed on the insulating plate; a semiconductor layer comprising a metal oxide, wherein the metal oxide has oxygen defects of less than or equal to 3%, and wherein the metal oxide comprises about 0.01 mole/cm³ to about 0.3 mole/cm³ of a 3d transition metal; a gate insulating layer disposed between the gate electrode and the semiconductor layer; and a source electrode and a drain electrode disposed on the semiconductor layer. Also described is a display substrate. The metal oxide has oxygen defects of less than or equal to 3%, and is doped with about 0.01 mole/cm³ to about 0.3 mole/cm³ of 3d transition metal. The metal oxide comprises indium oxide or titanium oxide. The 3d transition metal includes at least one 3d transition metal selected from the group consisting of chromium, cobalt, nickel, iron, manganese, and mixtures thereof.

6 Claims, 4 Drawing Sheets

THIN FILM TRANSISTOR SUBSTRATE, DISPLAY DEVICE HAVING THE SAME AND METHOD OF MANUFACTURING THE DISPLAY DEVICE

CROSS REFERENCE TO RELATED APPLICATIONS

This application is a divisional of U.S. patent application Ser. No. 12/197,573, filed on Aug. 25, 2008, which claims priority to Korean Patent Application No. 2008-28016, filed on Mar. 26, 2008, and all the benefits accruing therefrom under 35 U.S.C. §119, the contents of which in its entirety are herein incorporated by reference.

BACKGROUND OF THE INVENTION

1. Field of the Invention

This disclosure relates to a thin film transistor substrate, a display device having the thin film transistor substrate, and a method of manufacturing the display device.

2. Description of the Related Art

A thin film transistor is a three-terminal element having a gate terminal, a source terminal, and a drain terminal. It is an active element in which a semiconductor layer deposited on a substrate is used as a channel layer for transport of electrons or holes, where a voltage can be applied to the gate terminal to control a current flowing in the channel layer, thus acting as a switch to control the current between the source terminal and the drain terminal. Commercially, the most widely used thin film transistors are metal-insulator-semiconductor field effect transistors in which the channel layer is composed of a polycrystalline silicon layer or an amorphous silicon layer.

As the semiconductor layer, a metal oxide may also be used. During the formation of the metal oxide, oxygen defects in the metal oxide may form, which can make the metal oxide unsuitable for use as a channel layer. Accordingly, it is therefore desirable to form a metal oxide without oxygen defects that is suitable for use as a channel layer in a thin film transistor.

BRIEF SUMMARY OF THE INVENTION

In an exemplary embodiment, disclosed is a thin film transistor substrate having fewer oxygen defects and suitable electrical conductivity.

The above described and other drawbacks are alleviated by a thin film transistor substrate including: an insulating plate; a gate electrode disposed on the insulating plate; a semiconductor layer including a metal oxide, wherein the metal oxide has oxygen defects of less than or equal to 3%, and wherein the metal oxide includes about 0.01 mole/cm$^3$ to about 0.3 mole/cm$^3$ of a 3d transition metal; a gate insulating layer disposed between the gate electrode and the semiconductor layer; and a source electrode and a drain electrode disposed on the semiconductor layer.

Also disclosed in another exemplary embodiment is a display device having the thin film transistor substrate.

The above described and other drawbacks are alleviated by a display device including: a first insulating plate; a gate electrode disposed on the first insulating plate; a semiconductor layer comprising a metal oxide, wherein the metal oxide has oxygen defects of less than or equal to about 3%, and wherein the metal oxide includes about 0.01 mole/cm$^3$ to about 0.3 mole/cm$^3$ of a 3d transition metal; a gate insulating layer disposed between the gate electrode and the semiconductor layer; a source electrode and a drain electrode disposed on the semiconductor layer; a protection layer disposed on the source electrode and the drain electrode; a pixel electrode connected to the drain electrode; and a second insulating plate corresponding to the first insulating plate.

Also disclosed in another exemplary embodiment is a method of manufacturing the display device.

The above described and other drawbacks are alleviated by a method of manufacturing a display device including: disposing a gate electrode on the first insulating plate; disposing a gate insulating layer on the gate electrode; disposing a semiconductor layer on the gate insulating layer using a metal oxide under a gas with an oxygen partial pressure of about 13 mPa to about 13.3 Pa; and disposing a source electrode and a drain electrode on the semiconductor layer.

BRIEF DESCRIPTION OF THE DRAWINGS

The disclosed subject matter is particularly pointed out and distinctly claimed in the claims at the conclusion of the specification. The above and other aspects, features, and advantages of the disclosed embodiments will become readily apparent by reference to the following detailed description when considered in conjunction with the accompanying drawings wherein:

DETAILED DESCRIPTION OF THE INVENTION

Figure 1:
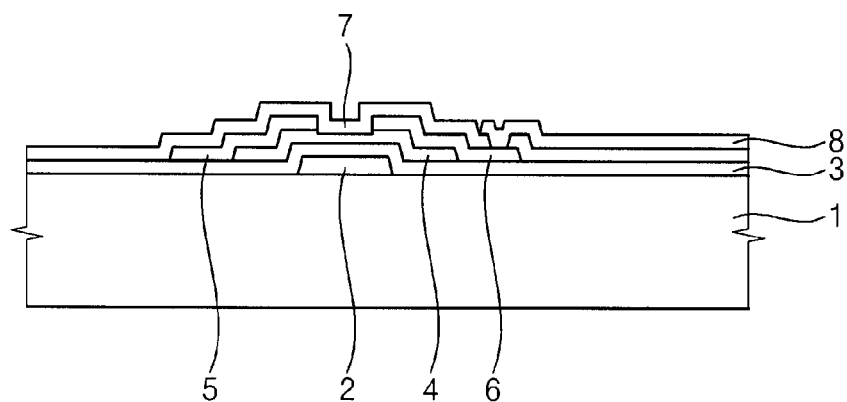
FIG. 1 is a cross-sectional view illustrating an exemplary embodiment of a thin film transistor substrate.

Embodiments will now be described more fully hereinafter with reference to the accompanying drawings, in which exemplary embodiments are shown. The disclosed embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section.

Thus, a first element, component, region, layer or section discussed below could be termed a second element, component, region, layer or section without departing from the teachings of this disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments are described herein with reference to cross section illustrations which are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of this disclosure.

Hereinafter, the exemplary embodiments will be described in detail with reference to the accompanying drawings.

FIG. 1 is a cross-sectional view illustrating an exemplary thin film transistor substrate.

A semiconductor layer according to an embodiment includes a metal oxide. The metal oxide can have oxygen defects and is doped with a 3d transition metal. The thin film transistor substrate, according to an embodiment, uses the semiconductor layer as a channel layer.

An exemplary thin film transistor substrate is shown in FIG. 1. The thin film transistor can be made by disposing a gate electrode 2 on a first insulating plate 1, and a gate insulating layer 3 on the gate electrode 2. A semiconductor layer 4 as a channel layer can be disposed on the gate insulating layer 3. A source electrode 5, and a drain electrode 6, can be disposed on the semiconductor layer 4. A protection layer 7 can be disposed on the source electrode 5 and the drain electrode 6. A pixel electrode 8 can be connected to the drain electrode 6.

The structure of the thin film transistor is not limited to the inverted staggered structure (bottom-gate structure) shown in FIG. 1, in which a gate insulating layer and a semiconductor layer are sequentially stacked on a gate electrode. Thus an exemplary thin film transistor may have a staggered structure (top-gate structure) in which a gate insulating layer and a gate electrode are sequentially stacked on a semiconductor layer.

The first insulating plate 1, for forming a thin film transistor, may comprise an insulating material. Exemplary insulating materials include glass, plastic, organic polymer, ceramic, a metal oxide, or the like, or a combination comprising at least one of the foregoing insulating materials. The insulating layer can be in the form of a film, such as a plastic film. Moreover, as described below, the semiconductor layer, according to an embodiment, can be disposed at room temperature. Thus, a thin film transistor can be disposed on a flexible material. An exemplary flexible material is polyethylene terephthalate film (PET).

Exemplary materials for the gate insulating layer 3 include $Al_2O_3$, $MgO$, $CeO_2$, $SiO_2$, $ScAlMgO$, $ZnO$, $InO$, $CdO$, or the like, or a combination comprising at least one of the forgoing materials. In another example, the gate insulating layer 3 may have at least two layers. For example, the gate insulating layer 3 may have a first layer, the first layer comprising a material such as $SiN_x$, and a second layer including a solid solution, the solid solution including at least two oxides selected from the group consisting of $SiO_2$, $Ta_2O_5$, $Al_2O_3$, $TiO_2$, $MgO$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, and the like, and a combination comprising at least one of the forgoing oxides. In another example, the gate insulating layer 3 may have a first layer, the first layer comprising $Al_2O_3$, and a second layer comprising $TiO_2$.

For example, SiNx of the first layer may be expanded to SiNx, TiNx, AlNx, etc. Alternatively, the nitrides may include SiNx, TiNx, AlNx or the like, or a combination comprising at least one of the foregoing nitrides. Also, ScAlMgO, ZnO, InO, CdO may be used over SiNx. The second layer over Al2O3 may be expanded to include other oxides, nitride, oxynitride, or the like, or a combination comprising at least one of the foregoing materials. An exemplary oxide may be TiO2.

When there is a defect at the interface between the gate insulating layer and the channel layer, electron mobility between the gate and channel layers can decrease and hysteresis can be observed as a transistor characteristic. In addition, a leak current can be dependent on the type of the gate insulating layer. Therefore, a suitable gate insulating layer for the channel layer can be selected.

The process of disposing the gate insulating layer 3, and the process of disposing the semiconductor layer 4, can be conducted at room temperature. Thus, a thin film transistor of a staggered or inverted staggered structure can be disposed.

The semiconductor layer 4 includes a metal oxide. The metal oxide has an oxygen defect concentration of less than or equal to about 5%, specifically less than or equal to about 3%, more specifically less than or equal to about 1%. The metal oxide can be doped with a 3d transition metal. Thus the metal oxide can comprise about 0.001 mole/cm$^3$ to about 1 mole/cm$^3$, specifically about 0.01 mole/cm$^3$ to about 0.3 mole/cm$^3$, more specifically about 0.05 mole/cm$^3$ to about 0.2 mole/cm$^3$ of the 3d transition metal.

Herein, "metal oxide" is defined as an oxide that shows a halo pattern in an X-ray diffraction spectrum and exhibits no particular diffraction line. The metal oxide can be substantially amorphous.

The metal oxide can exhibit increased electron mobility as the electron carrier concentration increases. The conductivity of the metal oxide can exhibit degenerate conduction. Degenerate conduction is defined as a state in which the thermal activation energy for temperature dependency of electrical resistance is 30 meV or less.

The metal oxide can be doped with the 3d transition metal. The doping concentration of the 3d transition metal mentioned above in the metal oxide can be measured at a temperature between about 0° C. to about 40° C., specifically about 25° C.

The doping concentration of the 3d transition metal can be about 0.001 mole/cm$^3$ to about 1 mole/cm$^3$, specifically about 0.01 mole/cm$^3$ to about 0.3 mole/cm$^3$, more specifically about 0.05 mole/cm$^3$ to about 0.2 mole/cm$^3$ of the 3d transition metal when determined at a temperature between about 0° C. to about 40° C. In an exemplary embodiment, the doping concentration of the 3d transition metal is about 0.01 to about 0.3 mole/cm$^3$ at 25° C.

The metal oxide includes indium oxide, titanium oxide, or a combination of at least one of the forgoing metal oxides.

As used herein, a 3d transition metal is a 3d transition metal whose 3d atomic orbital is partially filled with electrons, thus the elements with atomic number 21 to 29. Exemplary 3d transition metals include chromium, cobalt, nickel, iron, manganese, or a combination comprising at least one of the foregoing 3d transition metals.

The 3d transition metal doped in the metal oxide may create an energy level which helps electron conduction in the metal oxides. Electron transition can occur in the 3d transition metal because an electron in the 3d band can transit to the 4 s band. The 3d transition metal has magnetic moment, which affects the electrical characteristics of the semiconductor layer. When a certain amount of a magnetic material, such as a 3d transition metal, is doped in a semiconductor material, electron transition in the semiconductor material can more readily occur.

When indium oxide or titanium oxide is doped with chromium, cobalt, nickel, iron, manganese, or a combination comprising at least one of the foregoing 3d transition metals, electron carrier concentration can be controlled by the doping concentration of chromium, cobalt, nickel, iron, manganese, or a combination comprising at least one of the foregoing 3d transition metals. Moreover, materials having insulating to metallic electrical conductivity may be formed, which also makes it possible to manufacture a semiconductor layer in a thin film transistor.

The selection of the doping concentration of the 3d transition metal makes it possible to select the electrical conductivity of the metal oxide. In one embodiment, about 0.001 mole/cm$^3$ to about 1 mole/cm$^3$, specifically about 0.01 to about 0.3 mole/cm$^3$, more specifically about 0.05 mole/cm$^3$ to about 0.2 mole/cm$^3$ of 3d transition metal is doped in the metal oxide. In another embodiment, about 0.01 to about 0.2 mole/cm$^3$ of 3d transition metal is doped in the metal oxide. In this case, a semiconductor layer having suitable electrical conductivity can be obtained. The electron carrier concentration can be determined by Hall-effect measurement.

Figure 2:
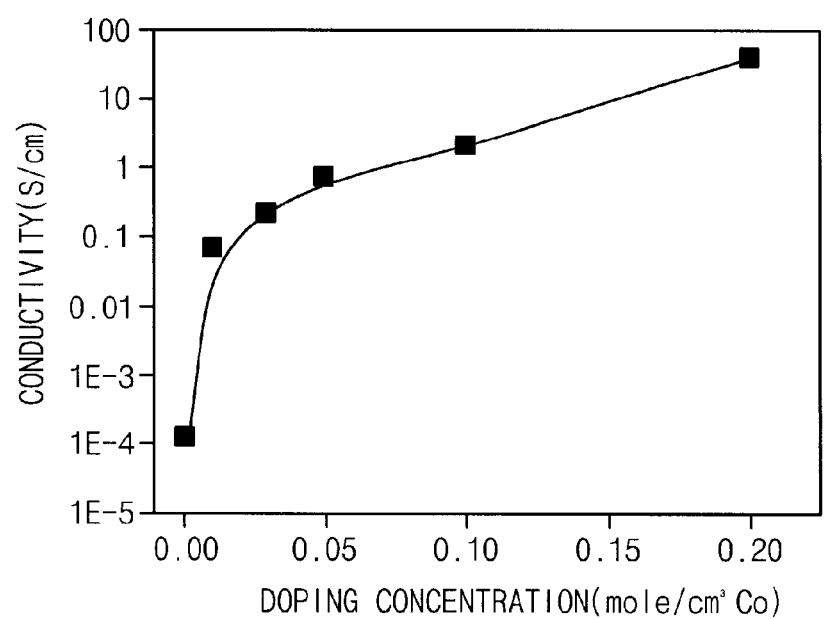
FIGS. 2 and 3 are exemplary graphs illustrating electrical conductivity as a function of doping concentration of a 3d transition metal.
Figure 3:
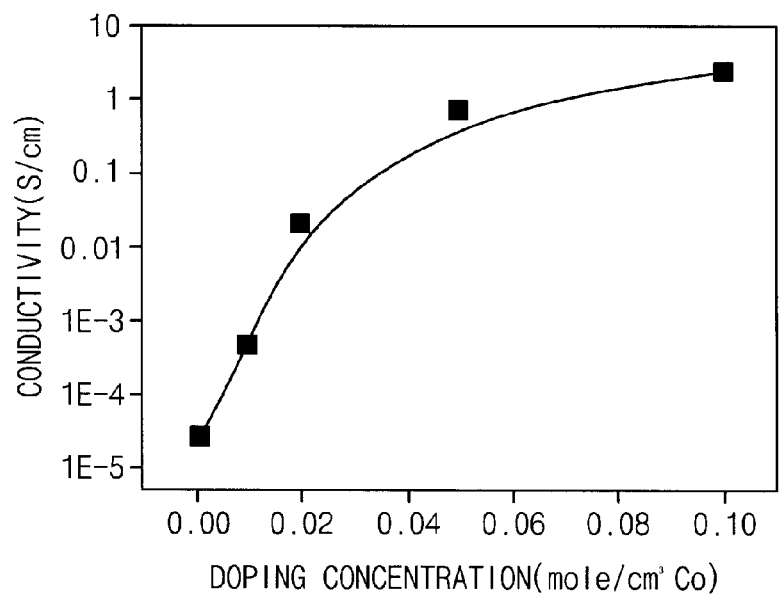

FIGS. 2 and 3 are graphs illustrating electrical conductivity as a function of a doping concentration of a 3d transition metal.

Referring to FIG. 2, indium oxide doped with about 0 to about 0.2 mole/cm$^3$ of cobalt has electrical conductivity of about 10$^{-4}$ S/cm to about 10 S/cm. Indium oxide doped with about 0 to about 0.2 mole/cm$^3$ of cobalt may be used as a semiconductor layer of a thin film transistor.

Referring to FIG. 3, titanium oxide doped with about 0 to about 0.1 mole/cm$^3$ of cobalt has electrical conductivity of about 10$^{-4}$ S/cm to about 100 S/cm. Titanium oxide doped with about 0 to about 0.1 mole/cm$^3$ of cobalt may be used as a semiconductor layer of a thin film transistor.

Exemplary methods to dispose the semiconductor layer, according to an embodiment, include vapor phase methods. Exemplary methods to dispose the semiconductor layer include sputtering, pulsed laser deposition, electron beam deposition, or the like, or a combination comprising at least one of the forgoing methods, when using an indium oxide or a titanium oxide as the metal oxide.

The 3d transition metal doping can be performed using various methods. An exemplary method of doping the 3d transition metal includes using the 3d transition metal as a precursor when indium oxide or titanium oxide is sputtered by direct current (DC) sputtering or radio frequency (RF) sputtering. In another embodiment, the 3d transition metal can be sputtered with indium oxide or titanium oxide at the same time. In another embodiment, 3d transition metal can be disposed by a vapor phase deposition method using indium oxide or titanium oxide.

During the disposing of the semiconductor layer, which can include indium oxide or titanium oxide, a pressure of a gas is selected so that a partial pressure of an oxygen containing gas is between about 0.2 Pa to about 20 Pa, specifically about 0.133 Pa (1 mTorr) to about 13.3 Pa (100 mTorr), more specifically about 0.05 Pa to about 5 Pa. The formation of the semiconductor layer can be performed under an inert gas atmosphere, such as an argon atmosphere. When an oxygen containing gas is used during the disposing, the oxygen containing gas can compensate for oxygen defects in the metal oxide. Oxygen defects can result from incomplete oxidation of a metal. Oxygen defects can cause missing oxygen atoms in the atomic lattice structure, or dangling bonds wherein a metal atom is incompletely bonded to oxygen. Oxygen defects or dangling bonds can generate excessive carriers, which can deteriorate the semiconductor layer. The oxygen containing gas that is used during the disposing of the semiconductor layer can compensate for oxygen defects in the metal oxide.

The oxygen containing gas can react with the semiconductor layer to more completely oxidize the semiconductor layer, thereby reducing oxygen defects and the concentration of dangling bonds, if present. Exemplary oxygen containing gases include oxygen, nitrous oxide, or the like, or a combination comprising at least one of the foregoing oxygen containing gases. The oxygen containing gas can be present in a mixture comprising an inert gas. Exemplary inert gases include argon, nitrogen, helium, or the like, or a combination comprising at least one of the foregoing inert gases.

When the partial pressure of the oxygen containing gas is less than about 13 mPa (0.1 mTorr), the metal oxide may have substantial electrical conductivity, specifically electrical conductivity greater than about 10 S/cm. When the partial pressure of the oxygen containing gas is more than about 13 Pa (100 mTorr), the oxygen concentration in the metal oxide can be too high, in which case the metal oxide can be an electrically resistance material, specifically a material with electrical resistivity lower than about $10^{-7}$ S/cm. A semiconductor material with electrical resistivity of about $10^{-1}$ S/cm to about $10^{-5}$ S/cm can be unsuitable for use as a channel layer in a thin film transistor.

Indium oxide, according to an embodiment, may be expressed by the formula $In_2O_{3-x}$ (wherein x denotes oxygen defect, and x is between about 0 to about 0.1, specifically about 0 to about 0.03, more specifically about 0.001 to about 0.02). The oxygen containing gas that is used during the disposing of the semiconductor layer can cause x to be less than or equal to about 0.03.

Titanium oxide, according to another embodiment, may be expressed by the formula $TiO_{3-y}$ (wherein y denotes oxygen defect, and y is between about 0 to about 0.1, specifically about 0 to 0.03, more specifically about 0.001 to about 0.02). The oxygen containing gas that is used during the disposing of the semiconductor layer can cause y to be less than or equal to 0.03.

Figure 4:
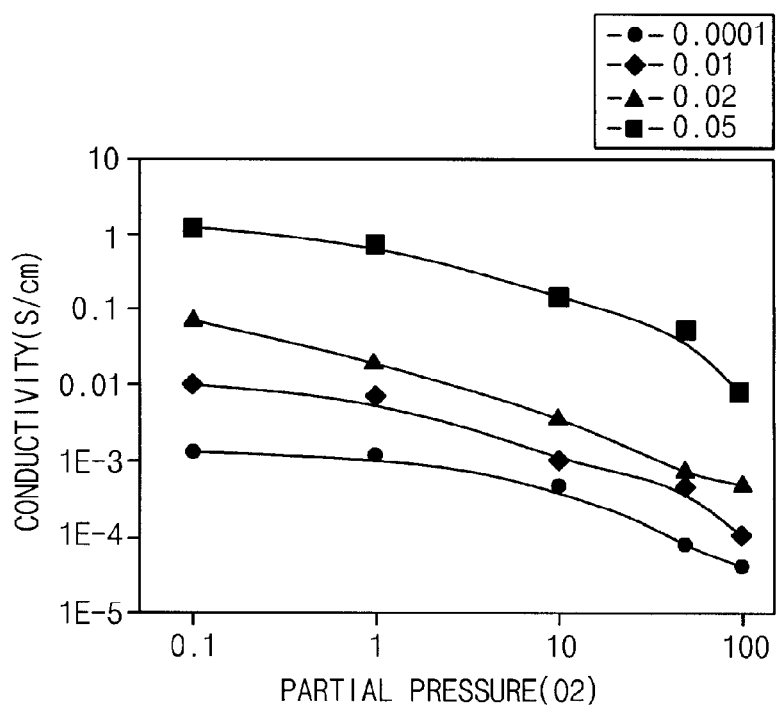
FIGS. 4 and 5 are exemplary graphs illustrating electrical conductivity as a function of an oxygen partial pressure.
Figure 5:
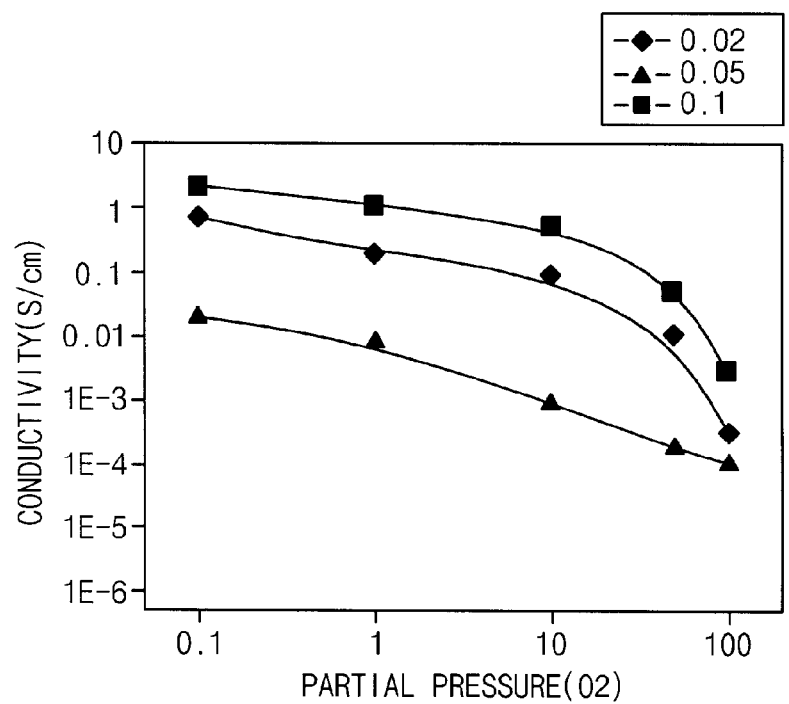

FIGS. 4 and 5 are graphs illustrating electrical conductivity as a function of a partial pressure of an oxygen containing gas.

In FIG. 4, electrical conductivity as a function of the partial pressure of the oxygen containing gas is shown when 0.001 mole/cm$^3$, 0.01 mole/cm$^3$, 0.02 mole/cm$^3$ and 0.05 mole/cm$^3$ of cobalt were doped in indium oxide as the 3d transition metal. When the partial pressure of the oxygen containing gas is selected to be between about 13 mPa (0.1 mTorr) to about 13 Pa (100 mTorr), the resulting indium oxide has electrical conductivity of about $10^{-4}$ S/cm to about 10 S/cm at room temperature.

In FIG. 5, electrical conductivity as a function of the partial pressure of the oxygen containing gas is shown when 0.01 mole/cm$^3$, 0.02 mole/cm$^3$ and 0.05 mole/cm$^3$ of cobalt were doped in titanium oxide as the 3d transition metal. When the partial pressure of the oxygen containing gas is selected to be between about 13 mPa (0.1 mTorr) to about 13 Pa (100 mTorr), the resulting indium oxide can have an electrical conductivity of about $10^{-4}$ S/cm to about 10 S/cm at room temperature.

Figure 6:
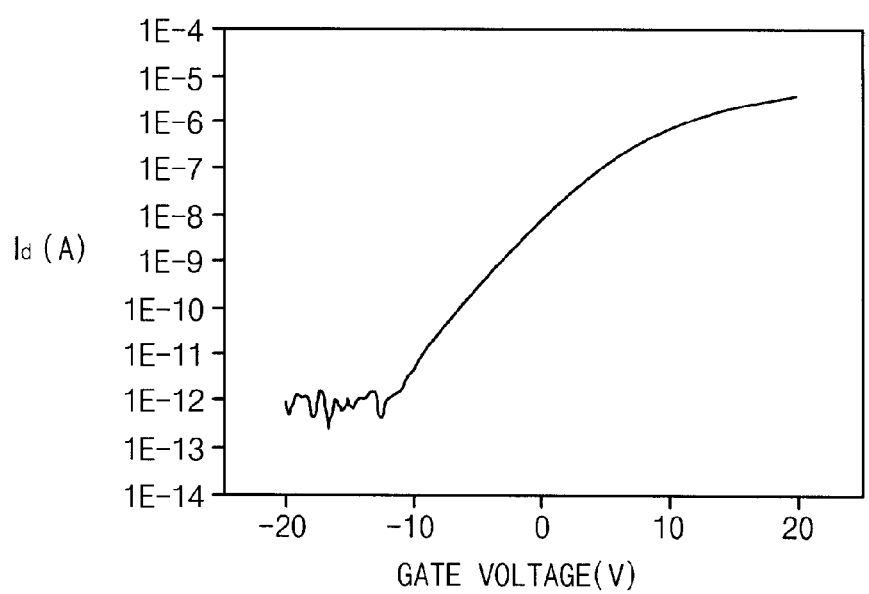
FIG. 6 is an exemplary graph illustrating drain current for a thin film transistor substrate as a function of gate voltage according to an embodiment.

FIG. 6 is a graph illustrating the drain current of a thin film transistor as a function of gate voltage according to an embodiment. In this embodiment, an Indium oxide layer doped with 0.02 mole/cm$^3$ of cobalt under 0.13 Pa (1 mTorr) of oxygen partial pressure was disposed to have a thickness of about 50 nanometers (500 Å). The resulting layer can be used as the semiconductor layer. When a voltage between a source electrode and a drain electrode ($V_{ds}$) is set at 10V, the drain current ($I_d$) changes according to a gate voltage ($V_g$) as is shown in FIG. 6. When the transistor is turned off, the drain current ($I_d$) is about $10^{-11}$ A. When the transistor is turned on, the drain current ($I_d$) is about $10^{-5}$ A. The on/off ratio is about $10^6$ A, which denotes that the transistor has suitable on/off characteristics for semiconductor applications.

EXAMPLE

Hereinafter, a method of manufacturing the semiconductor layer will be explained.

Figure 7:
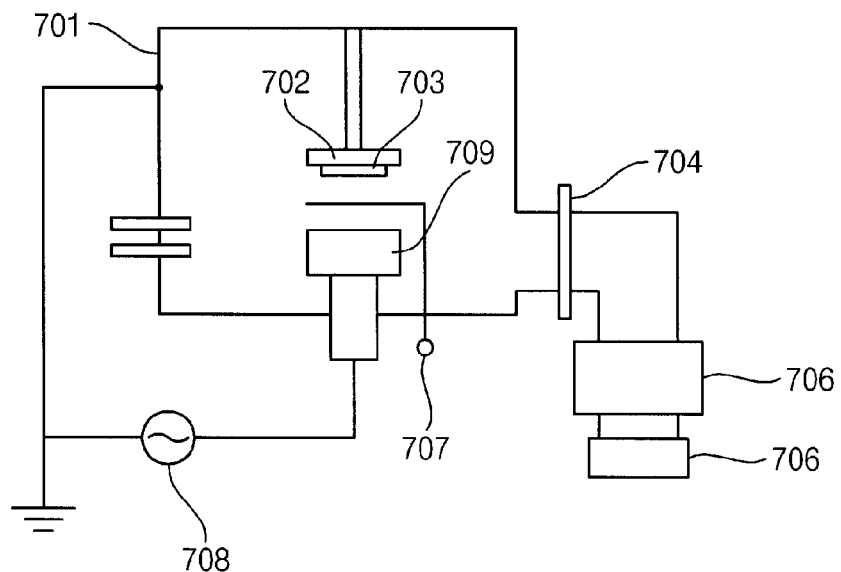
FIG. 7 is a cross-sectional view illustrating an exemplary device for sputtering metal oxide.

Formation of a semiconductor layer by a high-frequency sputtering method using argon gas as a sputtering gas is described. The sputtering method was conducted using the device shown in FIG. 7. As is shown in FIG. 7, reference numeral 703 denotes a substrate for deposition, 709 denotes a target, 702 denotes a substrate holder equipped with a cooling mechanism, 705 denotes a turbo molecular pump, 706 denotes a rotary pump, 707 denotes a shutter, 701 denotes a deposition chamber, and 704 denotes a gate valve. A SiO$_2$ glass substrate (#1737 produced by Corning) was used as the substrate 703 for deposition. As the pre-deposition treatment, the substrate was degreased with ultrasonic waves in acetone, ethanol, and ultrapure water for 20 minutes each, and then dried using a nitrogen gas at 100° C. The ultrapure water may be water with a resistivity of greater than about 18 mega-ohms An In$_2$O$_3$ sinter (size: 50 4 mm in diameter, 7 mm in thickness) was used as the target material. The ultimate vacuum inside the deposition chamber 701 was $1\times10^{-4}$ Pa. The total pressure of the oxygen containing gas and the argon gas during the deposition was controlled at a selected value between about 4 Pa to about $0.1\times10^{-1}$ Pa, and the oxygen partial pressure was selected to be between about $10^{-3}$ Pa to about $2\times10^{-1}$ Pa by selecting the partial pressure ratio of the argon gas and the oxygen containing gas. The oxygen containing gas may be an oxygen gas. The substrate temperature was room temperature, and the distance between the target 709 and the substrate 703 for deposition was 80 mm. In a pre-treating process, initial sputtering was performed for 5 minutes before the shutter was opened in order to stabilize the target material. The current injected was RF 150 W, and the deposition rate was 10 nm/min.

The resulting film was analyzed by grazing incidence x-ray diffraction (thin film method, incident angle greater than 0.5° from the film surface), but no clear diffraction peak was observed. Thus, the In—O thin film obtained was shown to be substantially amorphous. The In—O thin film was also analyzed by atomic force microscopy ("AFM"). It was observed by AFM that the root mean square roughness ($R_{rms}$) of the thin film was less than 1 nm, and the film thickness was about 70 nm. The results of X-ray photoelectron spectroscopy ("XPS") analysis showed that the metal composition ratio of the thin film was about In:O=2:2.97.

Figure 8:
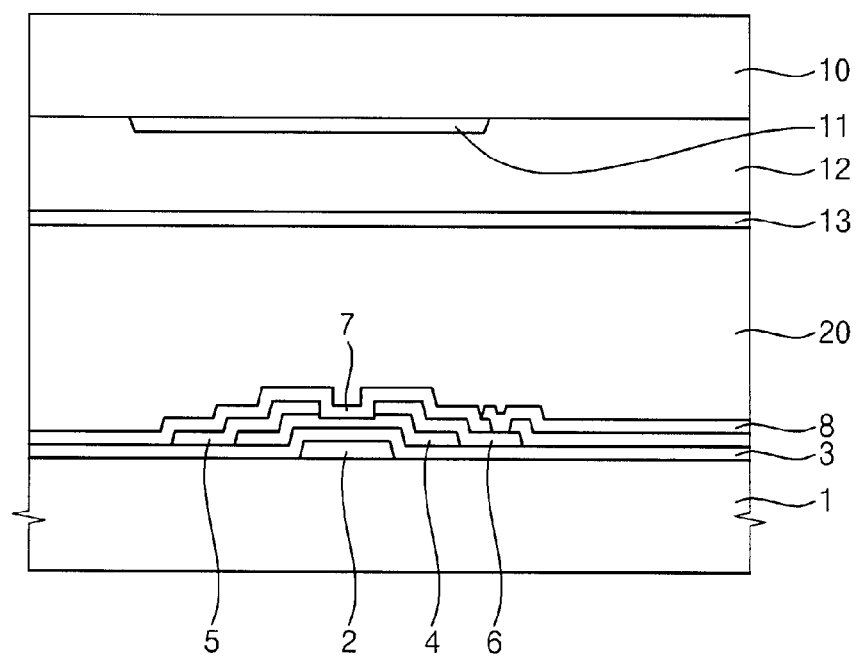
FIG. 8 is a cross-sectional view illustrating an exemplary display device. The detailed description explains the specific embodiments, together with advantages and features, by way of example with reference to the drawings.

FIG. 8 is a cross-sectional view illustrating a display device according to an embodiment.

The first insulating plate 1 and a thin film transistor formed on the first insulating plate 1 are substantially same as elements shown in FIG. 1. Thus, like numerals refer to like elements as described above with respect to FIG. 1 and further explanation of the like elements will be omitted.

Referring to FIG. 8, the display according to an exemplary embodiment includes a second insulating plate 10 corresponding to the first insulating plate 1. The second insulating plate 10 may include the same material as the first insulating plate 1. In another embodiment, the second insulating plate 10 may include soda lime glass.

In one embodiment, a black matrix 11 may be formed on the second insulating plate 10. The black matrix 11 blocks light from a backlight unit (not shown). A color filter 12 is formed on the black matrix 11. The color filter 12 may have a red color filter, a green color filter and blue color filter. In another embodiment, the black matrix 11 and/or the color filter 12 may be formed on the first insulating plate 1. In this case, the color filter 12 may be formed on the thin film transistor of the first insulating plate 1.

In one embodiment, a common electrode 13 is formed on the second insulating plate 10. In another embodiment, the common electrode 13 is formed on the first insulating plate 1.

A liquid crystal layer 20 may be interposed between the first plate 1 and the second insulating plate 10. The liquid crystal layer 20 is rearranged by an electric field formed between the first insulating plate 1 and the second insulating plate 10. Thus configured, when an electric field is applied to the liquid crystal layer 20, an arrangement of liquid crystal molecules of the liquid crystal layer 20 is altered to change optical transmissivity, so that an image is displayed.

The display device is not limited to liquid crystal displays. The display device may also include other display devices such as an organic light emitting device.

As is disclosed, a semiconductor layer including a metal oxide with reduced oxygen defects can be disposed.

Although the exemplary embodiments have been described, it is understood that this disclosure should not be limited to these exemplary embodiments but various changes and modifications can be made by one of ordinary skilled in the art within the spirit and scope of the disclosure as is hereinafter claimed.

What is claimed is:

1. A method of manufacturing a display device comprising:
disposing a gate electrode on the first insulating plate;
disposing a gate insulating layer on the gate electrode;
disposing a semiconductor layer on the gate insulating layer using a metal oxide represented by $In_2O_{3-x}$, or $TiO_{3-y}$, x and y independently denoting oxygen defects of 0 to 0.03, under a gas with an oxygen partial pressure of about 13 mPa to about 13.3 Pa; and
disposing a source electrode and a drain electrode on the semiconductor layer.

2. The method of claim 1, wherein the disposing of the semiconductor layer comprises a sputtering process.

3. The method of claim 2, wherein the sputtering process is performed in an argon gas atmosphere.

4. The method of claim 1, wherein the disposing of the semiconductor layer further comprises doping a 3d transition metal in the metal oxide at a concentration of about 0.01 mole/$cm^3$ to about 0.3 mole/$cm^3$.

5. The method of claim 4, wherein the disposing of the semiconductor layer further comprises doping the 3d transition metal in the metal oxide at a concentration of about 0.01 mole/$cm^3$ to about 0.2 mole/$cm^3$.

6. The method of claim 1, wherein, further comprising:
disposing a protection layer on the source electrode and the drain electrode;
disposing a pixel electrode on the protection layer; and
disposing a common electrode on a second insulating plate corresponding to the first insulating plate.

* * * * *